(12) United States Patent
Troyer

(10) Patent No.: US 11,316,511 B2
(45) Date of Patent: Apr. 26, 2022

(54) METHOD FOR REDUCING A THERMAL LOAD ON A CONTROLLABLE SWITCHING ELEMENT

(71) Applicant: Siemens Aktiengesellschaft, Munich (DE)

(72) Inventor: Markus Troyer, Raipoltenbach (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/050,644

(22) PCT Filed: Mar. 29, 2019

(86) PCT No.: PCT/EP2019/058037
§ 371 (c)(1),
(2) Date: Oct. 26, 2020

(87) PCT Pub. No.: WO2019/206564
PCT Pub. Date: Oct. 31, 2019

(65) Prior Publication Data
US 2021/0044288 A1    Feb. 11, 2021

(30) Foreign Application Priority Data
Apr. 27, 2018    (EP) .................................... 18169794

(51) Int. Cl.
*H02H 9/02* (2006.01)
*H03K 17/082* (2006.01)
(Continued)

(52) U.S. Cl.
CPC ......... *H03K 17/0822* (2013.01); *H02H 9/001* (2013.01); *H02H 9/025* (2013.01); *H03K 2017/0806* (2013.01)

(58) Field of Classification Search
CPC .......... H02H 9/001; H02H 9/02; H02H 9/025; H03K 2017/0806; H03K 17/082; H03K 17/0822
(Continued)

(56) References Cited

U.S. PATENT DOCUMENTS 6,225,797 B1    5/2001  Willis et al.
6,281,669 B1 *  8/2001  Brakus .................... G05F 1/573
                                                        323/324

(Continued)

FOREIGN PATENT DOCUMENTS

CN    106486989    3/2017
DE     20302275    6/2003
(Continued)

OTHER PUBLICATIONS

PCT International Search Report dated Jul. 15, 2019 based on PCT/EP2019/058037 filed Mar. 29, 2019.

*Primary Examiner* — William Hernandez
(74) *Attorney, Agent, or Firm* — Cozen O'Connor

(57) ABSTRACT

A method for reducing a thermal load on a switching element of an electronic fuse when switching on a load, wherein (a) a switching element is activated, (b) the switching element is deactivated and (c) the switching element is re-activated after reaching a set value of a switch-off duration, where steps (b) and (c) are repeated until an output voltage reaches a value that falls below a specified difference with respect to an input voltage of an electronic fuse or an output current reaches a specified duration current, where set values of a switch-on duration and/or switch-off current and the switch-off duration are maintained until new set values have been determined based on the output voltage, output current, and/or temperature, a pulse duty factor between the switch-on duration and the switch-off duration is adapted, (Continued)

and the specified maximum allowable temperature increase of the switching element is further observed.

19 Claims, 2 Drawing Sheets

(51) Int. Cl.
  *H02H 9/00* (2006.01)
  *H03K 17/08* (2006.01)
(58) Field of Classification Search
  USPC ............... 327/111, 175, 380, 427, 525, 581
  See application file for complete search history.

(56) References Cited

U.S. PATENT DOCUMENTS

| | | | |
|---|---|---|---|
| 6,347,028 B1* | 2/2002 | Hausman, Jr. | H03K 17/0822 361/93.1 |
| 6,552,889 B1 | 4/2003 | Huang et al. | |
| 2005/0135037 A1* | 6/2005 | Thiery | H02H 3/087 361/94 |
| 2006/0028257 A1* | 2/2006 | Huang | H03K 17/0822 327/175 |
| 2008/0310068 A1* | 12/2008 | Yabe | H03K 17/18 361/93.8 |
| 2011/0090604 A1* | 4/2011 | Butler | G05F 1/44 361/18 |
| 2014/0184185 A1 | 7/2014 | Torrisi et al. | |
| 2016/0241227 A1* | 8/2016 | Hirata | H03K 17/0822 |
| 2017/0063077 A1 | 3/2017 | Donath et al. | |
| 2017/0163255 A1* | 6/2017 | Graf | H03K 17/0822 |
| 2017/0294772 A1* | 10/2017 | Illing | H02H 9/025 |
| 2017/0294773 A1* | 10/2017 | Illing | H02H 3/093 |
| 2017/0294774 A1* | 10/2017 | Illing | H02H 3/087 |
| 2021/0083659 A1* | 3/2021 | Mayer | G01K 3/08 |

FOREIGN PATENT DOCUMENTS

| | | |
|---|---|---|
| EP | 1236257 | 9/2002 |
| EP | 1384303 | 1/2004 |

* cited by examiner

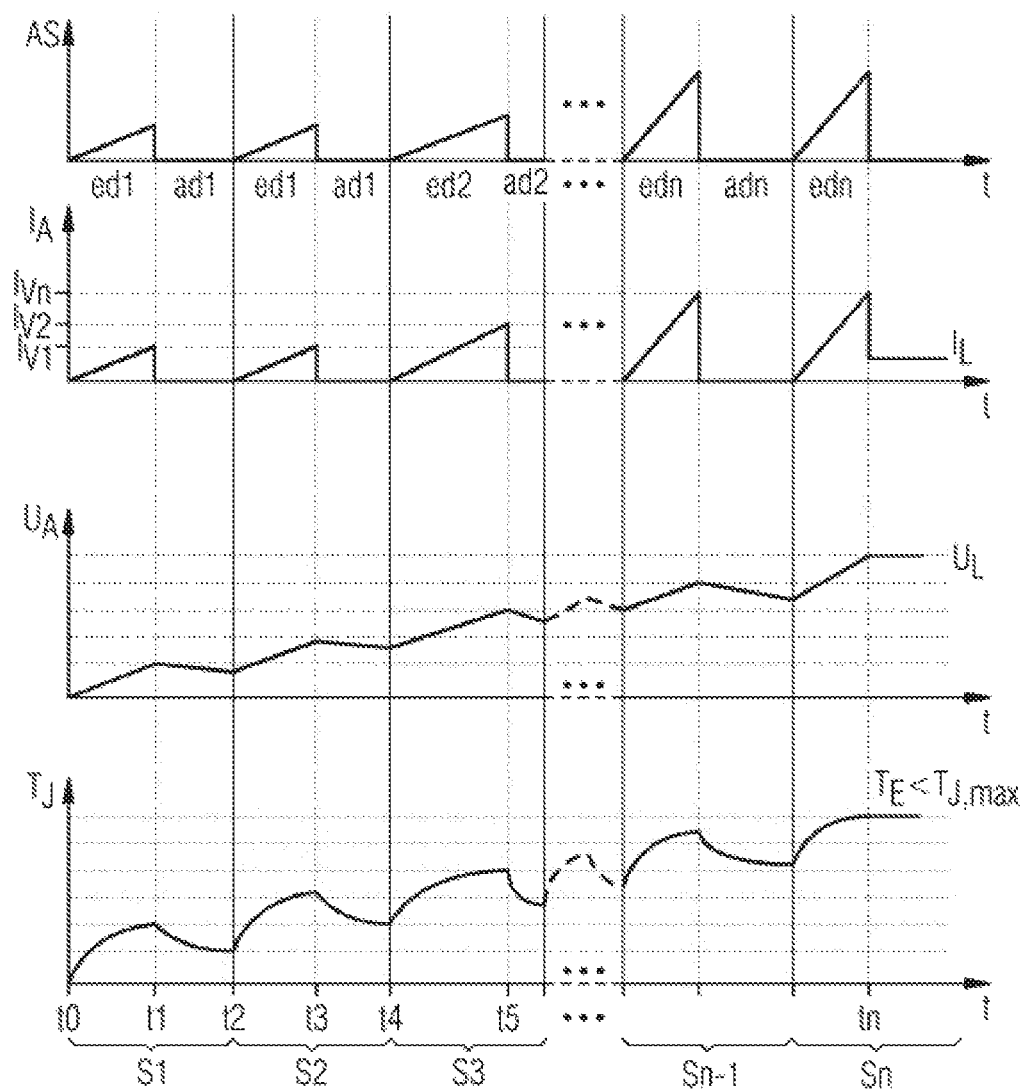

METHOD FOR REDUCING A THERMAL LOAD ON A CONTROLLABLE SWITCHING ELEMENT

CROSS-REFERENCE TO RELATED APPLICATIONS

This is a U.S. national stage of application No. PCT/EP2019/058037 filed 29 Mar. 2019. Priority is claimed on European Application No. 18169794.7 filed 27 Apr. 2018, the content of which is incorporated herein by reference in its entirety.

BACKGROUND OF THE INVENTION

1. Field of the Invention

The substantive invention relates to a method for reducing a thermal loading of a controllable switching element of an electronic fuse during switching on or during a switching-on process of a load, in particular a load having a capacitive portion or a capacitive load, where the switching element is driven via a drive signal with a predefined drive period having a switched-on duration and a switched-off duration of the switching element.

2. Description of the Related Art

Electronic fuses are used as a protection device nowadays in a multitude of devices, in particular between a voltage and/or current supply and an electric load. In the event of a short circuit or an overload, for example, an electronic fuse safely and rapidly interrupts a current flow into the load or component safeguarded in this way (e.g., a controller, a programmable logic controller, or a processor) in order to protect the load and associated leads against damage or destruction. To that end, an electronic fuse usually comprises a switching element, normally a semiconductor-based switch that interrupts the electric circuit.

Such an electronic fuse or monitoring unit for current supplies is known from EP 1 236 257 B1, for example.

In the case of electrical loads having a capacitive portion or in the case of capacitive loads, when this load is operationally connected to a voltage and/or current supply source (usually a DC voltage source), the capacitive portion can cause relatively rapidly increasing inrush currents. Here, the capacitive portions of the load or a capacitive load represent(s) an ideal capacitor which, upon a sudden voltage change being applied such as upon connection to the voltage supply, results in a theoretically infinite current pulse in accordance with the formula $i_c(t)=C*dU/dt$ or can represent an ideal short circuit at the switch-on instant. In practice, such current pulses are limited, for example, at least by the parasitic, resistive portions of the lines, resistive portions of the switching element, an equivalent series resistance (ESR) combining the resistive line and dielectric polarity-reversal losses of the capacitor, etc.

However, such inrush currents can still reach values which, e.g., within a few milliseconds or shorter, can result in a very rapid increase in the temperature of the switching element up to a switching element-specific switch-off temperature, at which the switching element is switched off or a possibly optional further protection device (e.g., fusible link, etc.) of the electronic fuse is caused to trigger in an undesired manner. At the switching element, e.g., primarily on account of a thermal loading, this temperature increase can lead to mechanical stress and to damage to the switching element in the medium term. In this regard, by way of example, a soldering of the switching element on a carrier material can be detrimentally affected by this and the lifetime of the switching element can thus be considerably reduced if such temperature increases occur relatively frequently.

In order to prevent damage to the switching element or undesired triggering of a possibly optional further protection device of the electronic fuse during switching on particularly of a load having a capacitive portion, it is necessary to appropriately limit the inrush currents and thus to reduce the thermal loading of the switching element. In this regard, e.g., by appropriately connecting up the switching element, it is possible to limit the inrush currents to a value which does not pose any danger to the switching element or that lies below a switch-off current value of an additional fuse device possibly present (e.g., additional fusible link).

To that end, the switching element is connected up, for example, such that it is used, e.g., as a controlled current source, i.e., with the use of a transistor (e.g., MOS-FET) as switching element, the transistor is operated in "linear operation". During linear operation, the transistor is neither fully turned off nor fully turned on. As a result of the switching element being appropriately connected up or operated in linear operation, for example, the sudden voltage change upon the load being switched on is converted into a constant current that charges the capacitive load portion until an operational output or load current is established. In this regard, a circuit for limiting an inrush current using a transistor is known from the document U.S. Pat. No. 6,225,797 B1, for example. However, primarily a dimensioning of the switching element or transistor has proved to be difficult here. Use in practice necessitates powerful components, in particular, which meet the requirements of an industrial application but the costs of which must still be at an acceptable level.

EP 1 384 303 B1 therefore discloses a power supply with safety cut-off in which the inrush currents are distributed between parallel branches and the energy loss is thus distributed between two switching elements in linear operation. Here, one of the two branches has an additional power resistor for current limiting. In order to achieve thermally expedient load sharing, for example, the driving of the switching elements has to be designed appropriately and the circuit thus has a relatively costly and complex circuit topology.

A further possibility of protecting the switching element against thermal loading is afforded by impedances additionally introduced into the circuit, for example. For this purpose, so-called NTC thermistors can be used, for example, which are fitted, e.g., in series with the switching element. An NTC thermistor, which changes its conductivity as the temperature increases, can reduce a high inrush current when at high impedance at the switch-on instant, for example. In the further course of events, the thermistor acquires low impedance as a result of absorbed energy loss and can conduct the continuous current established during normal operation. Alternatively, e.g., "PTC" thermistors in series with the switching element can also be used for current limiting at the switch-on instant. However, the PTC thermistors have the disadvantage that they must be deactivated for normal operation on account of their conductive behavior primarily at high temperatures, e.g., by means of via a parallel path (e.g., consisting of a transistor or relay). A further disadvantage of the use of thermally sensitive resistors, such as NTC thermistors or PTC thermistors, also consists in the required structural size. In order for the thermally sensitive resistor to absorb an energy loss that occurs at relatively high inrush currents and that is to be dissipated, relatively large resistor diameters are usually necessary. However, the production of such thermally sensitive resistors is relatively complex and cost-intensive.

Furthermore, the inrush currents can be limited by the switching element being connected up such that damage to the switching element is prevented by the predefinition of a limit temperature or of a predefined maximum permissible temperature swing. That is, although the current arising as a result of the limiting would thermally overload the switching element after a limiting time, the predefinition of a limit temperature or of a maximum permissible temperature swing has the consequence that the switching element is switched off before, e.g., damage to the switching element can occur.

DE 203 02 275 U1 discloses an electronic switch, for example, in which a current through a MOS-FET is limited to a predefined reference value via a regulating device. Here, in addition, the temperature of the MOS-FET is monitored and the switch is switched off when a predefined temperature threshold value is exceeded.

DE 10 2012 103 551 B4 likewise discloses an electronic fuse device in which, based on an output voltage present at a connected load, after the triggering of the fuse or after the opening of the switching element, it is ascertained whether there is a short circuit or only momentary current pulses on account of inrush currents or the charging of a capacitive load. To this end, the difference between an output voltage measured before and after the opening of the switching element is compared with a threshold value and the switching element is closed again if the difference exceeds the threshold value. Here, a temperature determining device can also be provided, which estimates the temperature of the switching element and/or of a fusible link based on an output current. This information is then used by a control device to check whether the temperature is below a predefined temperature threshold, and thus to prevent a permanent overload or damage of the switching element and/or of the fusible link by way of the opening of the switching element.

The electronic switch from the document DE 203 02 275 U1 and the electronic fuse from the document DE 10 2012 103 551 B4 remain switched off when the predefined temperature threshold is exceeded. However, it is, e.g., possible for the switching element to be switched on again after a defined cooling time until e.g., the predefined temperature threshold is reached again. With the switching element being repeatedly switched on and off in this way, the capacitive portion of the load is charged, for example. The inrush current spikes during the switching on of the switching element are thereby reduced until an operational continuous current (e.g., the current predefined at the output of the electronic fuse, or the rated current) is established. In order to dissipate the energy loss or thermal energy that arises as a result of the current pulses, e.g., parasitic resistive portions of lines, terminals, or the equivalent series resistance (ESR), are used, where as a result of the temporal limitation of the energy pulses, for the time being only parts of the switching element which participate directly in the current flow can absorb the energy loss or the heat that arises. Relatively large temperature swings thus arise, as a result of which the switching element is subjected to relatively high thermal stress. The lifetime of the switching element, but also the lifetime of other components of the electronic fuse, can be considerably shortened, for example, as a result. Primarily semiconductor-based switching elements age significantly more rapidly on account of thermal loading, for example.

Furthermore, U.S. Pat. No. 6,552,889 B1 discloses a method for operating an electronic switching element, primarily a metal-oxide-semiconductor field-effect transistor (MOS-FET), which ensures that the MOS-FET is operated within its permissible operating limits, in particular for temperature and current. To this end, a measuring transistor proportionally reduced in size is assigned to the switching element or MOS-FET, where the transistor is driven with the same control signal as the MOS-FET and thereby having a measurement current proportional to the current flow through the MOS-FET. As soon as the measurement current ascertained at the measuring transistor gives reason to expect that a predefined maximum permissible current flow via the MOS-FET has been reached or exceeded, the MOS-FET and the measuring transistor are switched off and the circuit is put into "pulsed gate" operation. During the latter, after a predefined waiting time, the MOS-FET and the measuring transistor are slowly switched on again via a ramped control signal for a predefined time duration and are switched off again upon the maximum permissible current flow being reached. This procedure is repeated until the predefined maximum permissible value is no longer exceeded by the current flow. Only then is the circuit or the MOS-FET switched to normal operation, as long as the current flow remains below the predefined maximum permissible value. As a result of the fixedly predefined switched-off duration during pulsed gate operation, the MOS-FET can indeed cool down, but the temperature swing during the switched-on duration and the cooling during the switched-off duration can fluctuate very greatly on account of different ambient conditions. Furthermore, the temperature swing during the switched-on duration can result in a relatively high loading of the switching element, which can adversely affect the lifetime.

SUMMARY OF THE INVENTION

In view of the foregoing, it is therefore an object of the invention to provide a method by which, in a simple and cost-saving manner, a thermal loading of an electronic fuse, in particular of a switching element, upon the switching on of a load, in particular a capacitive load, is reduced and a lifetime of the electronic fuse is significantly increased.

This and other objects and advantages are achieved in accordance with the invention by a method in which a switching element of an electronic fuse is driven via a drive signal, where the drive signal has a predefined drive period consisting of a switched-on duration and a switched-off duration of the switching element. A temporal profile of at least one output voltage present at the load and/or of an output current flowing into the load and/or of a temperature of the switching element is ascertained during the switching-on process of the load. Furthermore, predefined values governing compliance with a predefined maximum permissible increase in the temperature of the switching element within the predefined drive period are predefined for the switched-on duration of the switching element and/or for a switch-off current and for the switched-off duration of the switching element. In accordance with the invention, the method comprises:

a. switching on the switching element;
b. switching off the switching element upon at least reaching the predefined value of the switched-on duration or the switch-off current; and
c. switching on the switching element again upon reaching the predefined value of the switched-off duration.

In this case, steps b to c are performed repeatedly until the ascertained profile of the output voltage reaches a value at which, with respect to an input value of the electronic fuse, a predefinable difference is undershot i.e., a predefinable difference or a predefinable threshold value is undershot by a difference between input voltage and ascertained output voltage of the electronic fuse. Alternatively, performing steps b to c can be terminated if a predefinable maximum continuous current is at least undershot by the ascertained profile of the output current. In the event of repeatedly performing steps b to c, the predefined values for the switched-on duration and/or for the switch-off current and for the switched-off duration are maintained until, based on the ascertained profile of the output voltage and/or the output current and/or the temperature of the switching element, new predefined values are ascertained. Here, the new predefined values are ascertained such that the duty ratio between switched-on duration and switched-off duration of the switching element is adapted such that there is at least continuing compliance with a predefined maximum permissible increase in the temperature of the switching element within the drive period, or the increase is not reached. That is, a ratio between switched-on duration and switched-off duration of the switching element within the predefined drive period is correspondingly altered—if the switched-on duration is lengthened, for example, then the switched-off duration is correspondingly shortened, or vice versa, in order that the predefined drive period (e.g. a time duration of 100 μs to 10 ms) continues to be complied with.

The main aspect of the proposed solution in accordance with the invention is that the drive signal slows down and limits a temperature increase within the predefined drive period of the drive signal during the switching on of the load. In this case, the drive period can have a time duration that is preferably between 100 μs and 10 ms, and that is ideally 1 ms. To tis end, the switching element is initially driven repeatedly with the drive signal such that it is switched on and operated in linear operation only for a relatively short switched-on duration, i.e., predefined values that are low in relation to the switched-off duration are predefined for the switched-on duration and/or the switch-off current. As the output voltage at the load increases and/or the output current decreases relative to the predefinable maximum continuous current at the load or as long as the temperature of the switching element does not reach a predefined switching element maximum temperature (e.g., maximum permissible switching element temperature specified by manufacturer or data sheet, triggering temperature of an integrated protection device, etc.), it is possible to predefine new predefined values for switched-on duration and/or switch-off current and switched-off duration in the method according to the invention.

In this case, the switched-on duration is increased in relation to the switched-off duration, i.e., the switching element remains switched on longer during the predefined drive period of the drive signal, while the switched-off duration is reduced to the extent of a lengthening of the switched-on duration. Here, however, care is taken to ensure that the predefined maximum permissible increase in the temperature of the switching element within the drive period is at least not reached or is undershot. Furthermore, the predefined drive period and/or a frequency of the drive signal are/is chosen such that there is compliance with the predefined maximum permissible increase in the temperature of the switching element within the predefined drive period. The increases in the temperature of the switching element per switched-on duration (heating) are thus limited to a value which for example constitutes only a fraction (e.g., 1/10 to 1/50) of a total increase in the temperature of the switching element from room temperature (e.g., 25° C.) to the predefined switching element maximum temperature (e.g., 175° C.) and does not exceed or maximally reaches a predefined maximum permissible increase in the temperature of the switching element per drive period. The respective switched-off duration additionally gives the switching element time for cooling down. As a result, the thermal loading of the switching element, such as mechanical stress of a soldering between component and carrier material, is reduced and the lifetime of the switching element is lengthened.

Furthermore, the method in accordance with the invention provides that the heating of the switching element during the switching-on process of a load, in particular a capacitive load, is divided among a multiplicity of relatively small "micro" temperature swings, wherein, as a result of the corresponding predefined values for switched-on duration and/or switch-off current at which the switching element is switched off, the temperature increase in the switching element per drive period is kept as small as possible or a current pulse is kept short. As a result, the heating rate of the switching element is ideally decreased or an approximately linear temperature increase of the switching element is attained during the entire switching-on process of the load, which extends over a relatively long time. In this regard, e.g., soldered joints of the switching element can heat up more uniformly and an energy loss that is converted in the switching element and tha arises as a result of the charging of the capacitive portions of the load can be distributed over a larger thermal mass. That is, the energy loss which arises in the form of heat upon the switching on of the load with the capacitive portion can be dissipated more efficiently from the switching element to the immediate surroundings, such housing and subsequently via the air or can be emitted to cooling devices (e.g., heat sink, or copper surfaces). As a result, the switching element can absorb more energy loss overall and thus switch, for example, a load with a larger capacitive portion, without the switching element being damaged, for example. As a result of the reduction of the temperature increase and an associated more efficient distribution of the energy loss or of the heat produced, the lifetime of the switching element or of the electronic fuse is increased.

In addition, the load on an additional protection device (e.g. fusible link) that is possibly optionally present is also reduced and the dimensioning of said device is simplified. Such an additional protection device should trigger in the case of a fault upon failure of the electronic fuse (e.g., short circuit) in accordance with the requirements, for example, for the protection of the cables, but should not respond in the case of inrush current spikes. During the switching-on process of the load, e.g., more cost-effective variants or products can be used for such a protection device.

Ideally, the predefined values for the switched-on duration and/or the switch-off current and the switched-off duration can be maintained unchanged if the predefined maximum permissible increase in the temperature of the switching element is at least reached in the respective drive period. That is, if the switching element heats up at least to the extent of the predefined maximum permissible increase in temperature, then no new predefined values are predefined for the method in accordance with the invention, in order to continue to minimize a thermal loading or to prevent triggering of an additional protection device that is possibly optionally present.

If new predefined values are ascertained, then it is expedient if the duty ratio between switched-on duration and switched-off duration is reduced with an increase in the output voltage present at the load and/or a decrease in the output current flowing into the load relative to the predefinable maximum continuous current. That is, as long as (when carrying out the method) a maximum permissible increase in the temperature of the switching element that is predefined for the drive period is at least not reached within the drive period, the predefined value of the switched-on duration and/or of the switch-off current, with the increasing output voltage and/or with the output current decreasing relative to the predefinable maximum continuous current, is increased to an extent to which the predefined value of the switched-off duration is reduced, in order to comply with the predefined drive period. Here, the predefined drive period is preferably between 100 μs and 10 ms, and is ideally 1 ms.

It is advantageous if, from the temporal profile respectively ascertained for the output voltage and/or the output current and/or optionally the temperature of the switching element, the new predefined values for switched-on duration and/or switch-off current and switched-off duration of the switching element are derived and the drive signal is adapted to the new conditions. The inrush current spikes and thus the energy loss in the switching element decrease on account of the charging of the capacitive load portions, until a predefinable maximum continuous current is reached upon full charging of the capacitive load portions. As result, the predefined values can be correspondingly adapted. That is, the switched-on duration of the switching element can be lengthened, for example, and/or the switch-off current can be increased, for example, and the switched-off duration of the switching element can be correspondingly shortened, for example. Furthermore, switching on of a purely resistive load can be identified very rapidly, i.e., ideally as early as during the first switching cycle of the switching element (with the aid of the method in accordance with the invention by ascertaining the temporal profile particularly of the output voltage). In addition, with the method in accordance with the invention, it is also possible to easily identify a short circuit in a few switching cycles of the switching element.

It is expedient if the temporal profile respectively ascertained for the output voltage, the output current and/or the temperature of the switching element is averaged to ascertain the new predefined values of switched-on duration and/or switch-off current and switched-off duration. Here, the respective temporal profile ascertained is averaged, for example over an ascertaining duration of the new predefined values and, e.g., usable values are thus generated for the ascertaining method. The respective temporal profile can be averaged, for example, via mathematical methods such forming arithmetic mean values, or forming root-mean-square values. Alternatively, the averaging can, e.g., also be effected by filtering (e.g., via a low-pass filter or high-pass filter of arbitrary order) or by exclusion or selection of values from the temporal profile respectively ascertained.

Furthermore, it is advantageous if first predefined values for the switched-on duration and/or the switch-off current and the switched-off duration are determined based on a thermal model of the switching element. Furthermore, it is expedient if the predefined maximum permissible increase in the temperature of the switching element within the drive period is likewise determined based on the thermal model of the switching element. By way of example, a "Cauer" network or a "Foster" network can be used as a thermal model for the switching element, via which networks a thermal characterization of at least the switching element or the electric fuse can be effected. With the aid of the networks, in which thermally relevant layers in the heat path are represented, e.g. by thermal resistances and thermal capacitances, temperatures in an electronic system, such an electrical switching element, can be estimated or calculated very rapidly, for example. Thus, on the basis of the thermal model of the switching element, in a very simple manner, for example, it is possible to ascertain first predefined values for switched-on duration and/or switch-off current and switched-off duration of the switching element as starting values for the method in accordance with the invention or the drive period and a maximum permissible increase in temperature within the drive period, where thermal conditions of the switching element respectively used in the electronic fuse (e.g., junction temperature in the case of a transistor as switching element, thermal capacities of the switching element, or capability of forwarding the energy loss or heat) can be estimated and taken into consideration.

Ideally, a maximum possible current increase in the output current at the switching element, where the current increase is predefined by the drive signal, can additionally be taken into consideration by the respective thermal model. An evolution (dependent on the current increase) of the energy loss or heat in the switching element or in the electronic fuse and a temperature evolution dependent on the current increase in the switching element can thus be estimated in a simple manner. In particular, the first predefined values for the switched-on duration and/or the switch-off current and the switched-off duration as starting values for the method in accordance with the invention can thus be adapted to a maximum permissible increase in temperature within the predefined drive period.

Alternatively or additionally, in step b) the switching element can be switched off upon at least reaching the predefined maximum permissible increase in the temperature of the switching element. To this end, e.g., the ascertained temporal profile of the temperature of the switching element can be used to ascertain a present increase in the temperature of the switching element in the respective drive period. Alternatively, e.g., a present increase in the temperature of the switching element in the respective drive period can also be calculated on the basis of the ascertained temporal profile of the output current flowing into the load, because the power loss is proportional to the output current flowing into the load via the switching element.

Furthermore, it can be expedient if in step b), alternatively or additionally, the ascertained temporal profile of the temperature of the switching element is compared with a predefinable limit temperature, and the switching element is switched off upon at least reaching the limit temperature. The predefinable limit temperature (e.g., a temperature below a maximum permissible switching element temperature or triggering temperature of an integrated protection device) can likewise be ascertained in an advantageous manner based on the thermal model of the switching element.

The temperature of the switching element can be determined immediately (i.e. directly in the switching element) or indirectly at a housing of the switching element. In the case of an indirect temperature determination, e.g., a temperature at the housing or in a direct vicinity of the switching element is measured. A temperature within the switching element can then be deduced based on the measured temperature values. For a direct temperature determination, a switching element with integrated temperature measurement can be used, for example, in which, e.g., a junction temperature is determined directly. The use of the temperature of the switching element as a switch-off criterion for the switching element makes it possible very easily to prevent damage to the switching element or triggering of a possibly additional, integrated protection device.

In one preferred embodiment of the invention, the drive signal is derived from a predefined signal. This predefined signal is ideally ascertained from the temporal profile respectively ascertained for the output voltage and/or the output current and/or the temperature of the switching element and is advantageously generated by an evaluation unit. That is, based on the temporal profile of the output voltage, the output current and/or the temperature during the method in accordance with the disclosed embodiments of the invention, the evaluation unit ascertains or calculates the new predefined values, adapted to the respective conditions (e.g., state of charge of the capacitive load portions, or present temperature of the switching element), and passes them on to a drive unit based on the predefined signal.

The drive signal for the switching element for the switching element is then generated from the predefined signal by the drive unit. Here, the drive signal is ideally configured as a ramped signal that is used to drive the switching element (e.g., ramped signal for gate-source voltage in the case of a transistor as switching element). A ramped waveform of the drive signal makes it possible, for example, to limit the output current flowing through the switching element during the switching-on process in terms of the increase $di(t)/dt$ and/or in terms of the current value reached. As a result, for example, the increase in the temperature of the switching element can be minimized or limited to the predefined maximum permissible increase in the temperature of the switching element.

In one expedient embodiment of the invention, provides a monitoring unit is used to ascertain the temporal profile of at least the output voltage present at the load and/or the output current flowing into the load and/or the temperature of the switching element. In the monitoring unit, for example, in an advantageous manner, values of output voltage, output current and/or temperature ascertained via different measuring units can be combined to form temporal profiles and average values, e.g., over a calculation period can optionally be determined. The profiles and/or values ascertained by the monitoring unit can then be forwarded to the evaluation unit for further use, such as the calculation of new predefined values.

In an advantageous embodiment of the method in accordance with the invention, an impedance is additionally fitted in series with the switching element. The use of an impedance, formed, e.g., as an ohmic resistance having a fixed or variable resistance value, makes it additionally possible to damp and delay the current increase during the switching on of the load. Consequently, this also slows down the temperature increase in the switching element and intensifies a current-limiting effect of, e.g., parasitic losses (e.g., line losses, or internal resistance of the switching element). Alternatively, the impedance can also be configured as an inductance that prevents an excessively rapid current increase upon the switching element being switched on.

Ideally, a transistor, in particular a metal-oxide-semiconductor field-effect transistor (MOSFET), can be used as the switching element in the electronic fuse. A MOS-FET is among the field-effect transistors having an insulated gate, in the case of which the driving is effected via a control voltage (gate-source voltage) as a drive signal. The use of a MOSFET represents a simple and cost-effective realization of the switching element, where MOS-FETs can have a relatively high switching speed.

In a particularly specific embodiment the method in accordance with the invention, the switching element is formed together with the monitoring unit and the drive unit as an "integrated component". As a result, the circuit of the electronic fuse can be configured more simply and the structural size can be reduced further.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained below in an exemplary manner with reference to the accompanying figures, by way of example, in which:

FIG. 3 shows by way of example and schematically graphical plots of temporal profiles of a drive signal for the switching element, of an output current, of an output voltage and of a temperature of the switching element during the sequence of the method in accordance with the invention.

DETAILED DESCRIPTION OF THE EXEMPLARY EMBODIMENTS

Figure 1:
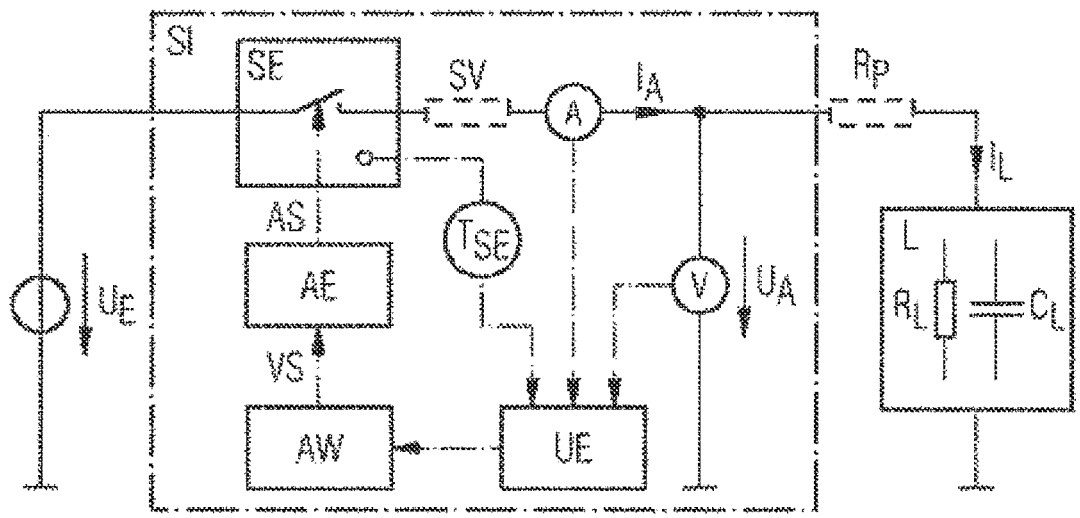
FIG. 1 shows an electronic fuse for performing the method for reducing a thermal loading of a switching element in accordance with the invention.

FIG. 1 shows by way of example and schematically an electronic fuse SI having at least one controllable switching element SE, where the fuse is configured for implementing the method in accordance with the invention for reducing a thermal loading of a switching element SE. The electronic fuse SI can be connected, for example, as a protection device between a supply source and an electrical load L. The supply source used is a voltage source, for example, which supplies an input voltage $U_E$. The electrical load L comprises for example, a resistive portion $R_L$ and a capacitive portion $C_L$, which can lead to relatively high inrush currents during a switching-on process or at the switch-on instant in the switching element SE of the electronic fuse SI. Furthermore, the electrical load can, e.g., also have an inductive portion. An output voltage $U_A$ of the electric fuse SI is present at the load L. An output current $I_A$ of the electric fuse SI flows into the load L, where a maximum permissible continuous current $I_L$ is settable for ongoing operation of the fuse. The continuous current $I_L$ can, for example, correspond to a "rated current" for the electrical load L or assume a predefinable value, usually below the rated current. During the switching-on process, the output current $I_A$ can assume values lying above the value of the continuous current $I_L$.

In addition, e.g. line losses, copper and line losses of the fuse SI, or internal resistance of the supply source, are represented as parasitic, ohmic resistance Rp, which at least slightly limits the inrush currents or the current pulse during the switching-on process. For further limiting of the inrush currents, for example, an impedance (not illustrated in FIG. 1) fitted in series with the switching element SE can be provided. Said impedance can be formed, e.g., as an ohmic resistance having a fixed or variable resistance value (e.g., as a thermistor). Alternatively, an inductance can also be used for the impedance, where the inductance prevents an excessively rapid current increase during the process of operationally connecting the load L to the switching element SE.

The electric fuse SI can optionally have an additional protection device SV besides the controllable switching element SE. The additional protection device SV used can be a fusible link, for example, which is intended to respond in the case of a fault (e.g., in the event of a fault such as a short circuit), but is not intended to be triggered by current pulses or inrush currents that arise during an operational switching-on process.

By way of example, a transistor (in particular a metal-oxide-semiconductor field-effect transistor or (MOS-FET) can be used as the switching element SE in the electric fuse. Ideally, an n-channel MOS-FET is used. The switching element SE is driven via a drive signal AS with a predefined drive period, where the drive signal is applied as a gate-source voltage, for example, and in the case of a MOS-FET as switching element SE. The drive period consists of a switched-on duration and a switched-off duration of the switching element and can have, e.g., a duration of from 100 µs to 10 ms (ideally of 1 ms). The drive signal AS can limit, e.g., a maximum possible current increase $di_A(t)/dt$ in the output current $I_A$ flowing into the load L during the switching-on process of the load L. The drive signal AS is generated from a predefined signal VS via a drive unit AE and is configured, for example, as illustrated in FIG. 3, in a ramped manner. The drive signal AS controls the increase in the temperature of the switching element SE during the drive period and optionally the current increase $di_A(t)/dt$ in the output current $I_A$ flowing into the load L, where the ramped waveform or a gradient of the drive signal AS allows, e.g., an increase in the output current $I_A$ through the switching element SE in a regulated manner and thus minimizes an increase in the temperature of the switching element during the respective drive period, in particular within the respective switched-on duration of the switching element, or limits it to a predefined maximum permissible increase in the temperature.

The predefined signal VS is ascertained by an evaluation unit AW on the basis of a temporal profile of the output current $I_A$ and/or the output voltage $U_A$ and/or a temperature of the switching element SE. That is, for generating the predefined signal VS, which also includes predefined values such as switched-off duration, switched-on duration and/or switch-off current for the method in accordance with the invention, at least one of the temporal profiles of output current $I_A$ or output voltage $U_A$ or temperature of the switching element SE is used as a reference variable. The predefined signal VS can be configured as a pulse-width modulated rectangular signal and predefines the respective configuration of the drive signal AS (e.g., gradient and length of the ramped waveform) for example by virtue of the predefined values being taken into consideration.

A monitoring unit UE is provided for ascertaining the temporal profiles of output current $I_A$ and/or output voltage $U_A$ and/or the temperature of the switching element SE. The monitoring unit UE collects, for example, measurement values of output current $I_A$ and/or output voltage $U_A$ and/or temperature of the switching element SE, which are ascertained, e.g., by corresponding sensor or measuring devices $T_{SE}$, A, V. In particular, in this case, the temperature of the switching element SE (as illustrated by way of example in FIG. 1) can be determined immediately directly at the switching element SE. Alternatively, the temperature of the switching element SE can also be ascertained indirectly at a housing of the switching element SE. Here, a temperature or an increase in the temperature of the switching element SE, primarily the "junction temperature", is deduced, for example, based on a measured housing temperature. Such an estimation of the temperature of the switching element SE or of the associated temporal profile can be effected, e.g., by the monitoring unit UE.

Furthermore, the switching element SE can be formed as an integrated component, where the integrated component can comprise at least the monitoring unit UE and the drive unit AW and possibly present sensor or measuring devices $T_{SE}$, A, V for, e.g., temperature, current and/or voltage.

Figure 2:
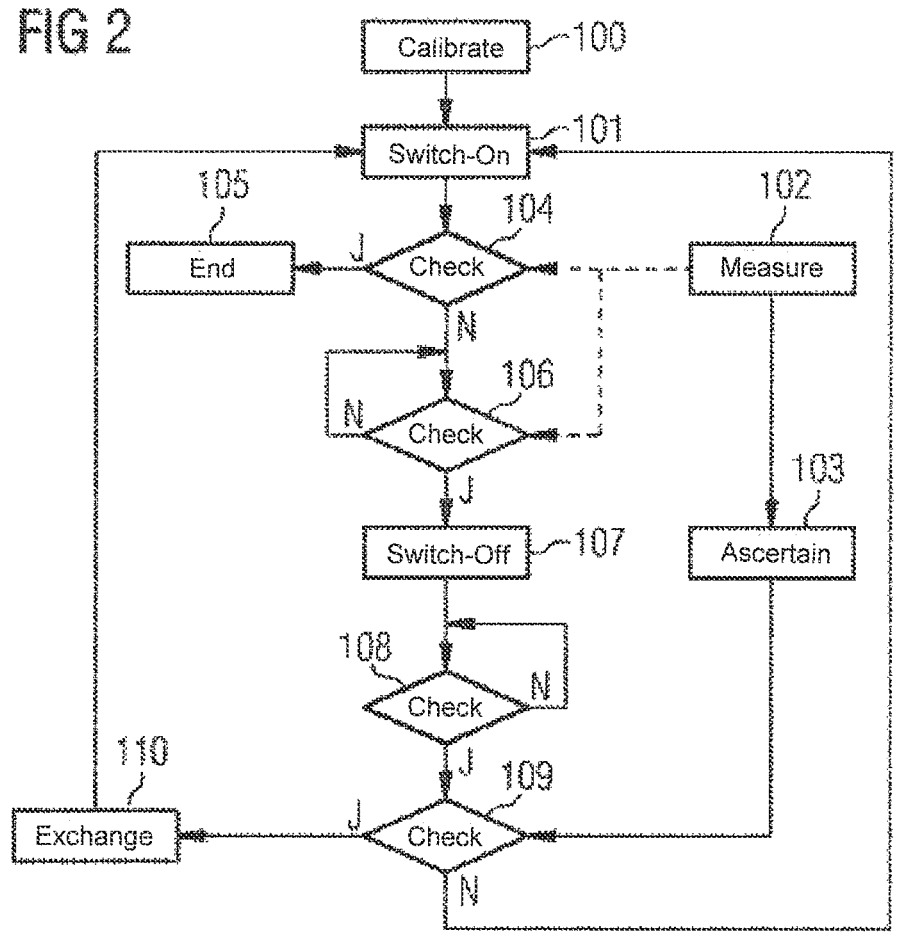
FIG. 2 shows an exemplary sequence of the method in accordance with the invention for reducing a thermal loading of a switching element during the switching on of a load.

FIG. 2 shows by way of example one preferred sequence of the method in accordance with the invention for reducing the thermal loading of a controllable switching element SE of an electric fuse SI as illustrated by way of example in FIG. 1.

The method begins with an initialization or calibration step 100. The calibration step 100 involves determining, based on the a thermal model of the switching element SE, such as a "Cauer" network or "Foster" network, first predefined values for a switched-on duration of the switching element SE and/or a switch-off current and for a switched-off duration of the switching element SE as starting values, where the predefined drive period can be formed, for example, by the first predefined values or starting values for the switched-on duration and the switched-off duration.

By way of example, specific parameters and/or predefinitions of the switching element SE respectively used in the electric fuse SI, such as maximum permissible junction temperature, can be taken into consideration here. Furthermore, the maximum possible current increase in the output current $I_A$ and/or a maximum permissible increase in the temperature of the switching element SE for the predefined drive period (e.g., maximum permissible temperature swing of the junction temperature within a switching cycle of the switching element SE) are/is derived from the thermal model. That is to say that in the calibration step 100, e.g., a maximum permissible temperature swing within the predefined drive period (e.g., of the junction temperature, of the switching element temperature) and/or a maximum permissible current increase $di_A(t)/dt$ in the output current $I_A$ are/is ascertained from the thermal model of the switching element SE for an unfavorable combination of the resistive portions $R_L$ and the capacitive portion $C_L$ of the load L. It is possible to derive therefrom, e.g., the first predefined values for the switched-on duration and/or a switch-off current and for a switched-off duration of the switching element SE and the predefined signal VS generated by the evaluation unit AW. The predefined signal VS (based on the first predefined values) is then forwarded to the drive unit AE and the first drive signal AS for the switching element SE is generated therefrom, e.g., as a ramped drive signal AS.

In a switch-on step 101, the switching element SE is switched on in a manner driven by the drive signal AS and the switching-on process is started. Here, the switching element SE is driven by the drive signal AS such that an increase in the temperature of the switching element SE remains as small as possible or the predefined maximum permissible increase in the temperature of the switching element SE is as far as possible not reached or not exceeded. Care is taken primarily to ensure that in particular a temporal profile of the junction temperature of the switching element SE does not exceed a critical value of the junction temperature and damage to the switching element SE does not occur. To that end, with the drive signal AS, for example, the increase in the temperature of the switching element within a drive period can be limited directly or indirectly by a limitation of the output current $I_A$ flowing into the load L or of the corresponding current increase $di_A(t)/dt$ during the switching on of the load L. In parallel with the switch-on step 101, in a measurement step 102 with the aid of sensor or measuring devices $T_{SE}$, A, V, for example, at least one of the temporal profiles of output current $I_A$ and/or output voltage $U_A$ and/or temperature of the switching element SE is ascertained by the monitoring unit UE.

On the basis of the temporal profiles respectively ascertained in the measurement step 102 for output current $I_A$ and/or output voltage $U_A$ and/or temperature of the switching element SE, in an ascertaining step 103, e.g., the evaluation unit AW then determines new predefined values for the switched-on duration of the switching element SE and/or the switch-off current and the switched-off duration of the switching element SE, where a duty ratio between switched-on duration and switched-off duration is thus adapted. In this regard, it is possible, e.g., to lengthen the switched-on duration via a corresponding new predefined value for the switched-on duration and/or the switch-off current to an extent to which the switched-off duration is reduced by a new predefined value for the switched-off duration. Furthermore, care is taken to ensure that the predefined maximum permissible increase in the temperature of the switching element SE within the drive period is at least not reached or is complied with.

To that end, for example, the temporal profiles respectively ascertained for output current $I_A$ and/or output voltage $U_A$ and/or temperature of the switching element SE can be used directly or in averaged form. The individual temporal profiles ascertained for output current $I_A$ and/or output voltage $U_A$ and/or temperature of the switching element SE can be averaged for example mathematically (e.g., by forming the respective arithmetic mean or by forming root-mean-square values) or alternatively via filtering (for example, using low-pass or high-pass filters of arbitrary order) or by means of exclusion or selection of ascertained values from the respective temporal profile.

Furthermore, the measurement step 102 and the ascertaining step 103 are performed in parallel with or largely independently of other steps for performing the method in accordance with the invention. A predefinition checking step 109 then involves checking whether new predefined values for the switched-on duration and/or the switch-off current and the switched-off duration have been determined by the evaluation unit AW.

A termination checking step 104 involves checking whether the ascertained temporal profile of the output voltage $U_A$ has reached a value at which, with respect to the input voltage $U_E$ of the electronic fuse SI, a predefinable difference is undershot. That is, a check is made, for example, to establish whether a difference between input voltage $U_E$ and output voltage $U_A$ (e.g., an average value from the temporal profile ascertained) undershoots a predefinable tolerance value. Alternatively, the termination checking step 104 can also involve checking whether a predefinable maximum continuous current $I_L$ is undershot by the ascertained temporal profile of the output current $I_A$. An average value from the ascertained temporal profile of the output current $I_A$, for example, can be used in this case, too. If either the temporal profile of the output voltage $U_A$ reaches a value at which, with respect to the input voltage $U_E$ of the electronic fuse SI, a predefinable difference is undershot or a predefinable maximum continuous current $I_L$ is undershot by the temporal profile of the output current $I_A$, then the method in accordance with the invention is terminated or ended in an end step 105. The termination checking step 104 can be performed by the evaluation unit AW, for example. The temporal profiles of output voltage $U_A$ and/or output current $I_A$ can be determined in the measurement step 102, for example.

If the termination conditions predefined in the termination checking step 104 are not met, then the switching element SE remains switched on until a switching checking step 106 establishes that the predefined value of the switched-on duration (e.g. the starting value for the switched-on duration of the switching element SE in the case of a first switching cycle of the switching element SE) is at least reached. Alternatively or additionally, the switching checking step 106 can also check whether the predefined value or, in the first switching cycle of the switching element SE, the predefined starting value of the switch-off current is at least reached or exceeded by the respective output current $I_A$ presently ascertained in the measurement step 102. The switching checking step 106 can be performed by the evaluation unit AW, for example.

The switching checking step 106 can alternatively or additionally check whether the predefined maximum permissible increase in the temperature of the switching element SE has been reached or exceeded in the present switching cycle of the switching element SE or in the present drive period of the drive signal AS. The switching element SE can then be switched off. The present increase in the temperature of the switching element SE can for example be determined based on the profile of the temperature of the switching element SE as ascertained in the measurement step 102 or be calculated or estimated, e.g., based on the temporal profile of the output current $I_A$ flowing into the load L as ascertained in the measurement step 102.

Furthermore, in the switching checking step 106, alternatively or additionally, the temporal profile of the temperature of the switching element SE as ascertained in the measurement step 102 can be compared with a predefinable limit temperature for the switching element SE. The switching checking step 106 then checks whether the predefinable limit temperature is at least reached or exceeded by the ascertained temperature profile. The predefinable limit temperature for the switching element SE can be derived from the thermal model of the switching element SE, for example.

If the switching checking step 106 establishes that either the predefined value of the switched-on duration or the predefined value of the switch-off current has been reached or exceeded, then the switching element SE is switched off in a switch-off step 107. Additionally or alternatively, reaching or exceeding the predefined maximum permissible increase in the temperature of the switching element SE within a drive period and/or reaching the predefinable limit temperature by the ascertained temporal profile of the temperature at the switching element SE can also result in the switch-off step 107 being performed or in the switching element SE being switched off.

The switching element SE then remains switched off until the predefined value of the switched-off duration or, in the first switching cycle, the starting value of the switched-off duration is at least reached or exceeded. The reaching of the predefined switched-off duration is checked in a switch-off checking step 108. If the predefined switched-off duration is reached, then the predefinition checking step 109 can ascertain whether new predefined values for the switched-on duration and/or the switch-off current and the switched-off duration have been determined in the ascertaining step 103, e.g., by the evaluation unit AW based on the ascertained temporal profiles of output current $I_A$ and output voltage $U_A$ and/or the temperature of the switching element SE.

If no new predefined values have been ascertained, then the previous predefined values continue to be used at least for the next switching cycle of the switching element SE or pass of the method. The switching element SE is then switched on again in the switch-on step 101, wherein the predefined values and thus the drive signal AS remain unchanged.

If new predefined values for the switched-on duration and/or the switch-off current and the switched-off duration are present, then the previous predefined values are replaced by the new predefined values in an exchange step 110 and are used for the predefined signal VS or output with the latter. That is, the predefined signal VS is adapted, e.g., by the evaluation unit AW based on the new predefined values and is converted into a new or adapted drive signal AS for the switching element SE via the drive unit. The switching element SE is then switched on with the adapted drive signal AS in the switch-on step 101. As a result, for example, an increase in the temperature of the switching element SE within the drive period, in particular during the new switched-on duration, can again be kept below the predefined maximum permissible increase in temperature and/or a possible current increase $di_A(t)/dt$ through the switching element SE can be altered or regulated (as illustrated by way of example in FIG. 3).

Alternatively, the predefinition checking step 109 can also be performed before the switch-off checking step 108. That is, the predefinition checking step 109 and, if appropriate, if new predefined values for switched-on duration and/or switch-off current and switched-off duration of the switching element SE are present, the exchange step 110 are performed before the check as to whether the predefined value of the switched-off duration of the switching element SE has been reached in the switch-off checking step 108.

The method in accordance with the invention is then performed until the termination checking step 104 establishes that one of the termination conditions is met, and is ended with the end step 105, where the switching element SE remains operationally switched on.

FIG. 3 illustrates by way of example and schematically a graphical plot of the temporal profile of the drive signal AS for the switching element SE and corresponding temporal profiles of the output current $I_A$, the output voltage $U_A$ and the temperature $T_J$ of the switching element SE during the sequence of a plurality of repetitions of the method in accordance with the invention until termination or ending by the termination checking step 104 or the end step 105. Here, the illustration shows by way of example in a topmost diagram the temporal profile of the drive signal AS, in a first middle diagram the temporal profile of the output current $I_A$, in a second middle diagram the temporal profile of the output voltage $U_A$ and in a bottommost diagram the temporal profile of a temperature $T_J$ of the switching element SE, in particular of a junction temperature $T_J$. Here, time t is plotted on the respective x-axis and the drive signal AS for the switching element SE and a corresponding profile of the output current $I_A$ and of the output voltage $U_A$ and of the temperature $T_J$ of the switching element SE are respectively plotted on the respective y-axis. The switching element SE undergoes, for example, passes of the method in accordance with the invention or switching cycles S1 to Sn with a predefined, largely constant drive period (consisting of switched-on duration ed1, . . . , edn and switched-off duration ad1, . . . , adn. A switching cycle or the predefined drive period can have for example a duration of from 100 μs to 10 ms) ideally a duration of 1 ms.

The calibration step 100 involves predefining for the method, based on the thermal model of the switching element SE, a first predefined value ed1 for the switched-on duration, a first predefined value ad1 for the switched-off duration and/or a first predefined value $I_{V1}$ for the switch-off current, which govern compliance with a maximum permissible increase in the temperature of the switching element SE per drive period, where the increase is likewise determined in the calibration step 100. In the switch-on step 101, the switching element is switched on at a first point in time t0 via the drive signal AS and a first switching cycle S1 is thus started. For this purpose, the drive signal AS can have a ramped waveform. Here, an increase in the temperature of the switching element SE is limited, either directly or indirectly via a limitation of the current increase $di_A(t)/dt$ in the output current $I_A$ through the switching element SE, as illustrated in the first middle diagram for example in a temporal profile of the output current $I_A$. That is, the current through the switching element SE or the output current $I_A$ increases proportionally to or in a manner regulated by the drive signal AS.

The capacitive portion $C_L$ of the load L is charged by the energy transferred via the switching element SE, an increase in the output voltage $U_A$ as illustrated in the second middle diagram is also effected. The temperature $T_J$ of the switching element SE (as illustrated in the bottommost diagram) and an energy loss converted in the switching element SE also increase analogously to the increase in the output current $I_A$. Here, care is taken to ensure that the increase in the temperature $T_J$ or the temperature increase turns out to be significantly smaller in comparison with a maximum permissible temperature $T_{J,max}$ and the predefined maximum permissible increase in the temperature of the switching element SE is complied with.

If it is established at a second point in time t1 in the switching checking step 106 of the first switching cycle S1 that either the first predefined value ed1 for the switched-on duration or the first predefined value $I_{V1}$ for the switch-off current is reached or exceeded, then the switching element SE is switched off by the drive signal AS in the switch-off step 107. That is, the drive signal AS is ended as illustrated in the topmost diagram, as a result of which, as illustrated in the first middle diagram, the output current $I_A$ through the switching element goes to a value 0. The output voltage $U_A$ decreases, as illustrated in the second middle diagram, because after the switching element SE has been switched off, the capacitive portion $C_L$ of the load L is discharged again, for example, through the resistive portion $R_L$ of the load L. Furthermore, the temperature $T_J$ of the switching element SE also decreases (as illustrated in the bottommost diagram) because, during the switched-off duration ad1, heating of the switching element SE that arose during the switched-on duration ed1 is at least partly emitted, e.g., to the surroundings, such as housing and subsequently to cooling devices (e.g., heat sink, or copper surfaces).

The charging of the capacitive portion $C_L$ of the load or the increase in the output voltage $U_A$ has the consequence that less energy loss is converted in the switching element SE. That is, the predefined values for switched-on duration ed1, edn and/or switch-off current $I_{V1}$, . . . , $I_{Vn}$ and switched-off duration ad1, . . . , adn can be adapted for at least one following switching cycle S2, . . . , Sn and thus the drive signal AS. At least one of the temporal profiles of output current $I_A$ and/or output voltage $U_A$ and/or temperature $T_J$ of the switching element SE is used for this purpose. New predefined values can be calculated by the evaluation unit AW such that a duty ratio between switched-on duration and switched-off duration of the switching element SE is adapted (e.g., reduced), where the predefined maximum permissible increase in the temperature of the switching element SE within the drive period is still complied with or not reached or exceeded.

Once the switch-off checking step 108 has established that the first predefined value ad1 of the switched-off duration has been reached or exceeded, at a third point in time t2, the switching element SE is switched on by the switch-on step 101 for a second switching cycle S2. The predefinition checking step 109 has established that, e.g., as yet no new predefined values for ed1, edn and/or switch-off current $I_{V1}$, ..., $I_{Vn}$, and switched-off duration ad1, ..., adn are present or have been calculated by the evaluation unit AW. As a result, the first predefined values ed1, ad1, $I_{V1}$ continue to be used for the second switching cycle S2. That is, as illustrated in the topmost diagram, the profile of the drive signal AS in the second switching cycle S2 corresponds to the profile in the first switching cycle S1. It is once again evident from the first middle diagram that the output current $I_A$ likewise increases proportionally to the drive signal AS. However, as illustrated in the second middle diagram, the output voltage $U_A$ increases further on account of the further charging of the capacitive portion $C_L$ of the load L in the second switching cycle S2. It is evident from the bottommost diagram that the temperature $T_J$ of the switching element SE also increases further.

If, at a fourth point in time t3, the switching checking step 106 of the second switching cycle S2 establishes that either the first predefined value ed1 for the switched-on duration or the first predefined value $I_{V1}$ for the switch-off current is reached or exceeded, then the switching element SE is switched off again by the drive signal AS in the switch-off step 107, until the first predefined value ad1 of the switched-off duration is reached at a fifth point in time t4. The predefinition checking step 109 has then established that new predefined values ed2, $I_{V2}$, ad2 for switched-on duration and/or switch-off current and switched-off duration are present or have been calculated by the evaluation unit AW, for example. As a result, the new predefined values ed2, ad2, $I_{V2}$ are adopted for a third switching cycle S3 in the exchange step 110.

On the basis of these new predefined values ed2, ad2, $I_{V2}$, a new predefined signal VS and thus a new drive signal AS (as illustrated by way of example in the topmost diagram for the third switching cycle S3) are then generated. With the new drive signal AS, the switching element SE is then switched on again in the switch-on step 101. The switching element SE is switched off again in the switch-off step 107 at a sixth point in time t5 (upon the new predefined value ed2 of the switched-on duration being reached or upon the new predefined value $I_{V2}$ of the switch-off current being reached) until the new predefined value ad2 of the switched-off duration is reached. Here, it is evident that in the third switching cycle S3, by virtue of the new predefined values, the switched-on duration ed2 has been lengthened to an extent to which the switched-off duration ad2 has been shortened, where the drive period or the duration of the third switching cycle S3 of the switching element SE has remained approximately the same.

The method is performed until, e.g., in an n-th switching cycle of the switching element SE, at a point in time tn, the termination checking step 104 establishes that the ascertained temporal profile of the output voltage $U_A$ has reached a value at which, with respect to the input voltage $U_E$ of the electronic fuse SI, a predefinable difference is undershot. That is, an output voltage $U_A$ or $U_L$ corresponding approximately to the input voltage $U_E$ of the electrical fuse SI is established. Alternatively, the termination checking step 104 can also check whether a predefinable maximum continuous current $I_L$ is reached or undershot by the ascertain temporal profile of the output current $I_A$. Here, the established output current $I_A$ or $I_L$ corresponds to the established output voltage $U_L$ divided by the resistive portion $R_L$ of the load. The capacitive portion $C_L$ of the load L is fully charged at the point in time tn. If either the temporal profile of the output voltage $U_A$ reaches a value at which, with respect to the input voltage $U_E$ of the electronic fuse SI, a predefinable difference is undershot or a predefinable maximum continuous current $I_L$ is reached or undershot by the temporal profile of the output current $I_A$, then the method according to in accordance with the invention is terminated or ended in an end step 105 and the switching element SE remains switched on for ongoing operation. It is evident from the bottommost diagram that an approximately constant end temperature $T_E$ for ongoing operation is established at the switching element SE at the point in time tn. The end temperature $T_E$ is usually below a maximum permissible temperature $T_{J,max}$, which can be predefined, e.g., switching-element-specifically or by a triggering temperature of an optional additional protection device SV.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for reducing a thermal loading of a controllable switching element of an electronic fuse during a switching-on process of a load (L), the switching element being driven via a drive signal with a predefinable drive period comprising a switched-on duration and a switched-off duration, a temporal profile of at least one of (i) at least one output voltage presenting at the load (ii) an output current flowing into the load and (iii) a temperature of the switching element being ascertained during the switching-on process, and predefined values governing compliance with a predefined maximum permissible increase in a temperature of the switching element within the predefinable drive period being predefined for at least one of (i) the switched-on duration of the switching element and (ii) a switch-off current, and for the switched-off duration of the switching element, the method comprising:

a) switching on the switching element;
b) switching off the switching element upon at least reaching the predefined value of the switched-on duration or the switch-off current;
c) switching on the switching element again upon reaching the predefined value of the switched-off duration;
d) and performing steps b to c until an ascertained profile of the output voltage reaches a value at which, with respect to an input voltage of the electronic fuse, a predefinable difference is undershot, or until a predefinable maximum continuous current is at least undershot by the ascertained profile of the output current, wherein the predefined values for at least one of (i) the switched-on duration and (ii) the switch-off current and for the switched-off duration are maintained until, based on at least one of (i) the ascertained profile of the output voltage, (ii) the output current and (iii) the temperature of the switching element, new predefined values are ascertained such that a duty ratio between the switched-on duration and the switched-off duration of the switching element is adapted such that at least continuing compliance with the predefined maximum permissible increase in the temperature of the switching element within the predefinable drive period occurs.

2. The method as claimed in claim 1, wherein a duty ratio between the switched-on duration and the switched-off duration is reduced with at least one of (i) an increase in the output voltage present at the load and (ii) a decrease in the output current flowing into the load relative to the predefinable maximum continuous current.

3. The method as claimed in claim 2, wherein at least one of (i) the temporal profile respectively ascertained for the output voltage, (ii) the output current and (iii) the temperature of the switching element is averaged to ascertain the new predefined values of at least one of (i) the switched-on duration and (ii) the switch-off current, and switched-off duration.

4. The method as claimed in claim 1, wherein at least one of (i) the temporal profile respectively ascertained for the output voltage (ii) the output current and (iii) the temperature of the switching element is averaged to ascertain the new predefined values of at least one of (i) the switched-on duration and (ii) the switch-off current, and switched-off duration.

5. The method as claimed in claim 1, wherein first predefined values for at least one of (i) the switched-on duration and (ii) the switch-off current, and for the switched-off duration and the predefined maximum permissible increase in the temperature of the switching element within the predefinable drive period are determined based on a thermal model of the switching element.

6. The method as claimed in claim 5, wherein the thermal model of the switching element comprises one of a Cauer network and a Foster network.

7. The method as claimed in claim 1, wherein the switching element is switched off upon at least reaching the predefined maximum permissible increase in the temperature of the switching element.

8. The method as claimed in claim 1, wherein the ascertained temporal profile of the temperature of the switching element is compared with a predefinable limit temperature; and wherein the switching element is switched off upon at least reaching said predefinable limit temperature.

9. The method as claimed in claim 1, wherein the temperature of the switching element is determined at one of (i) a housing of the switching element, (ii) in a direct vicinity of the switching element and (iii) immediately directly in the switching element.

10. The method as claimed in claim 1, wherein the drive signal is derived from a predefined signal; and wherein the predefined signal is determined from the temporal profile respectively ascertained for at least one of (i) the output voltage, (ii) the output current and (iii) the temperature of the switching element.

11. The method as claimed in claim 10, wherein the predefined signal is generated by an evaluation unit.

12. The method as claimed in claim 11, wherein the drive signal is generated from the predefined signal by a drive unit.

13. The method as claimed in claim 1, wherein the drive signal comprises a ramped signal.

14. The method as claimed in claim 1, wherein at least one of (i) the temporal profile of at least the output voltage present at the load, (ii) the output current flowing into the load and (iii) the temperature of the switching element is ascertained by a monitoring unit.

15. The method as claimed in claim 1, wherein an impedance is additionally fitted in series with the switching element.

16. The method as claimed in claim 1, wherein the switching element comprises a transistor.

17. The method as claimed in claim 16, wherein the transistor is a MOS-FET.

18. The method as claimed in claim 1, wherein the switching element is formed at least together with a monitoring unit and a drive unit to form an integrated component.

19. The method as claimed in claim 1, wherein the load comprises a capacitive load.

* * * * *